United States Patent [19]

Yamagishi et al.

[11] Patent Number: 5,349,155
[45] Date of Patent: Sep. 20, 1994

[54] INSULATING MATERIAL FOR WIRING SUBSTRATE AND METHOD OF PRODUCING MULTI-LAYERED WIRING SUBSTRATE

[75] Inventors: Yasuo Yamagishi; Tamotsu Owada, both of Kawasaki, Japan

[73] Assignee: Fujitsu Limited, Kanagawa, Japan

[21] Appl. No.: 5,105

[22] Filed: Jan. 15, 1993

[30] Foreign Application Priority Data

Jan. 17, 1992 [JP] Japan .................. 4-006105
Jan. 20, 1992 [JP] Japan .................. 4-007926

[51] Int. Cl.$^5$ ............................. B23K 26/00
[52] U.S. Cl. .................. 219/121.71; 219/121.82; 219/121.85
[58] Field of Search ........... 219/121.7, 121.71, 121.85, 219/121.82; 427/53.1; 156/443

[56] References Cited

U.S. PATENT DOCUMENTS 4,784,901 11/1988 Hatakeyama et al. .
4,915,981 4/1990 Traskos et al. .............. 219/121.7 X
5,034,801 7/1991 Fischer .
5,063,280 11/1991 Inagawa et al. ................ 219/121.7

FOREIGN PATENT DOCUMENTS 0248617 9/1987 European Pat. Off. .

OTHER PUBLICATIONS

Nikkei Micro-Device, Dec., 1989, pp. 50–55.
Chemtronics, vol. 4, Sep. 1989, Guilford GB, pp. 149–152, XP85761 Bachman "Excimer Lasers in a Fabrication Line for a Highly Integrated Printed Circuit Board".
European Search Report dated May 17, 1993.

*Primary Examiner*—C. L. Albritton
*Attorney, Agent, or Firm*—Armstrong, Westerman, Hattori, McLeland & Naughton

[57] ABSTRACT

This invention relates to an insulating material for a wiring substrate and to a method of producing a multi-layered wiring substrate, and is directed to put into practical application a multi-layered wiring substrate suitable for processing high speed signals. The production method of the multi-layered wiring substrate of this invention uses an insulating material prepared by allowing voids of a porous perfluorocarbon polymer film to be impregnated with a thermosetting resin containing a benzocyclobutene ring, and thermally setting the resin, and comprises laminating alternately a wiring layer and an insulating layer made of the insulating material for the wiring substrate on a rigid support substrate.

5 Claims, 3 Drawing Sheets

INSULATING MATERIAL FOR WIRING SUBSTRATE AND METHOD OF PRODUCING MULTI-LAYERED WIRING SUBSTRATE

BACKGROUND OF THE INVENTION

1. Field of the Invention

This invention relates to an insulating material for a wiring substrate and a method of producing a multi-layered wiring substrate using the insulating material.

To reduce the size of an electronic device and to improve its operation speed, a higher density wiring substrate, to which a semiconductor integrated circuit is to be mounted, is necessary with the improvement in the integration density of the semiconductor integrated circuit.

The integration density of the wiring substrate has been improved from a single layer printed board at the outset to a multi-layered printed board and to a surface package, and a multi-chip module (MCM) capable of coping with a semiconductor chip package and capable of attaining a higher density has been developed.

Although a ceramic wiring substrate produced by a thick film formation method can be used as a substrate of the MCM, a thin film multi-layered wiring substrate using a polyimide having a lower dielectric constant than ceramics as an insulating layer and alternately laminating a layer of copper (Cu) wirings on this insulting layer has been developed and put into practical application in the field of large scale computers where higher speed of signals are required. (Refer, for example, to "Nikkei Micro-Device", December, 1989, pp 50–55.)

2. Description of the Related Art

The polyimide which has been developed and put into practical application as an insulating material for a wiring substrate has high heat resistance and a low dielectric constant ( $\epsilon = 3.4$ ).

However, this material is not devoid of the problem that it has high hygroscopicity due to its imide ring having high polarity, so that an apparent dielectric constant increases upon absorption of moisture and the insulating properties deteriorate.

Since a signal propagation speed is inversely proportional to $\epsilon^{\frac{1}{2}}$, the demand for materials having a lower dielectric constant than polyimides has increased.

A perfluorocarbon polymer (such as polytetrafluoroethylene (abbreviated to "PTFE")) is known as a material having low hygroscopicity, high heat resistance and an extremely low dielectric constant.

The perfluorocarbon resin as typified by PTFE is a material with a dielectric constant ( $\epsilon$ ) which is as low as about 2.0, and exhibits excellent heat resistance because the bond energy between carbon and fluorine is very high.

Furthermore, since this material has extremely low hygroscopicity and excellent chemical resistance, it has already been used as a substrate of a printed wiring board.

According to a thin film formation method it alternately laminates a wiring layer and an insulating layer individually, however, a rigid support substrate made of ceramics or a metal and the insulating layer, the insulating layer and a wiring metal, and the insulating layer and the insulating layer, must be adhered with one another. For this reason, PTFE has not been used as the insulating material for a multi-layered wiring substrate because adhesion of PTFE other than fusion has been difficult.

To apply PTFE to the thin film formation method, a method has been devised which renders PTFE porous by biaxial stretching, or the like, and then allows this porous film to be impregnated with a resin having high adhesion.

In other words, a dielectric constant and hygroscopicity can be reduced while retaining necessary adhesion and heat resistance by making PTFE composite with a resin.

The essential condition of the impregnation resin for PTFE according to this method is that porous PTFE can be impregnated with the resin and can be bonded by heat treatment, or the like.

As material satisfying this condition, a prepreg material "Gore-tex GTM-051 Series" (products of Japan Gore-tex Inc.) prepared by allowing porous PTFE to be impregnated with a bis-maleimide triazine resin (abbreviated to the "BT resin") as a low molecular weight thermosetting resin has been available commercially.

However, the BT resin has a considerably low heat resistance of not higher than 300° C. and considerably high dielectric constant ( $\epsilon$ ) of more than 3.5. Therefore, even when this resin is made composite with porous PTFE, the dielectric constant of the resulting composite film cannot be reduced to 3.0 or less.

The perfluorocarbon polymers typified by PTFE are insulating materials having a low dielectric constant, but cannot as such be used for an inter-level insulating film of a multi-layered wiring substrate because their adhesion is extremely low.

On the other hand, a prepreg material prepared by allowing porous PTFE to be impregnated with the BT resin is commercially available for improving the adhesion of PTFE, but the heat resistance of the BT resin is up to about 300° C. and the dielectric constant of the composite film is as great as about 3.0.

It is therefore a technical problem to obtain a thermosetting resin having excellent heat resistance but a low dielectric constant and capable of impregnation, to put an excellent multi-layered wiring substrate material into practical application by allowing porous PTFE to be impregnated with such a resin, and to form a multi-layered wiring substrate using an insulating material.

One of the important technical problems when forming a thin film multi-layered wiring is to form via holes of an inter-level insulating layer.

The thin film formation method employs the step of laminating a wiring layer individually in the same way as in the case of the formation of a semiconductor integrated circuit. For this reason, the use of reactive ion etching (RIE) has been examined for the formation of the via holes, too.

In the thin film circuit, however, the insulating layer is incomparably thicker than the semiconductor. To etch this thick insulating layer, a metal film having high dry etching resistance must be used as a resist layer. For this reason, a complicated process comprising the steps of: formation of the metal film→coating of a photoresist→exposure→development of the photoresist→etching of the metal resist→etching of the insulating film→removal of the metal resist.

In a thin film circuit using the polyimide as the insulating layer, therefore, a method that applies photosensitivity to a polyimide precursor and forms a via hole by utilizing photosensitivity of the material has been examined in order to simplify the fabrication process.

Nonetheless, the via hole cannot be formed by utilizing photosensitivity in the material impregnated with the thermosetting resin having adhesion to porous PTFE, and for this reason, the use of RIE requiring complicated steps becomes necessary.

Accordingly, a method of forming the via holes by a simple process must be accomplished for porous PTFE impregnated with the thermosetting resin.

As already described, the formation of the via holes utilizing photosensitivity cannot be carried out for those materials that are prepared by allowing porous PTFE to be impregnated with the adherable resin.

It is therefore important to materialize a method of forming the via holes by a simple and practical method.

SUMMARY OF THE INVENTION

The first technical problem described above can be solved by a method of producing a multi-layered wiring substrate that uses an insulating material for a wiring substrate, prepared by allowing void portions of a porous perfluorocarbon polymer film to be impregnated with a thermosetting resin containing a benzocyclobutene ring and curing the composite material, and which alternately laminates a wiring layer and an insulating layer made of the insulating material for a wiring substrate described above on a rigid support substrate.

The second technical problem described above can be solved by a method in which holes of a wiring substrate are formed for forming via holes in an insulating film of a multi-layered wiring substrate by utilizing ablation by an excimer laser beam, wherein the insulating film is prepared by allowing a porous perfluorocarbon polymer film to be impregnated with a thermosetting resin containing an aromatic ring or hetero ring in the structure thereof, and the via holes are formed by using a krypton fluoride (KrF) or xenon chloride (XeCl) excimer laser beam having a wavelength of not smaller than 190 nm and an emission time of at least 1 ns per pulse.

DESCRIPTION OF THE PREFERRED EMBODIMENTS

Figure 1:
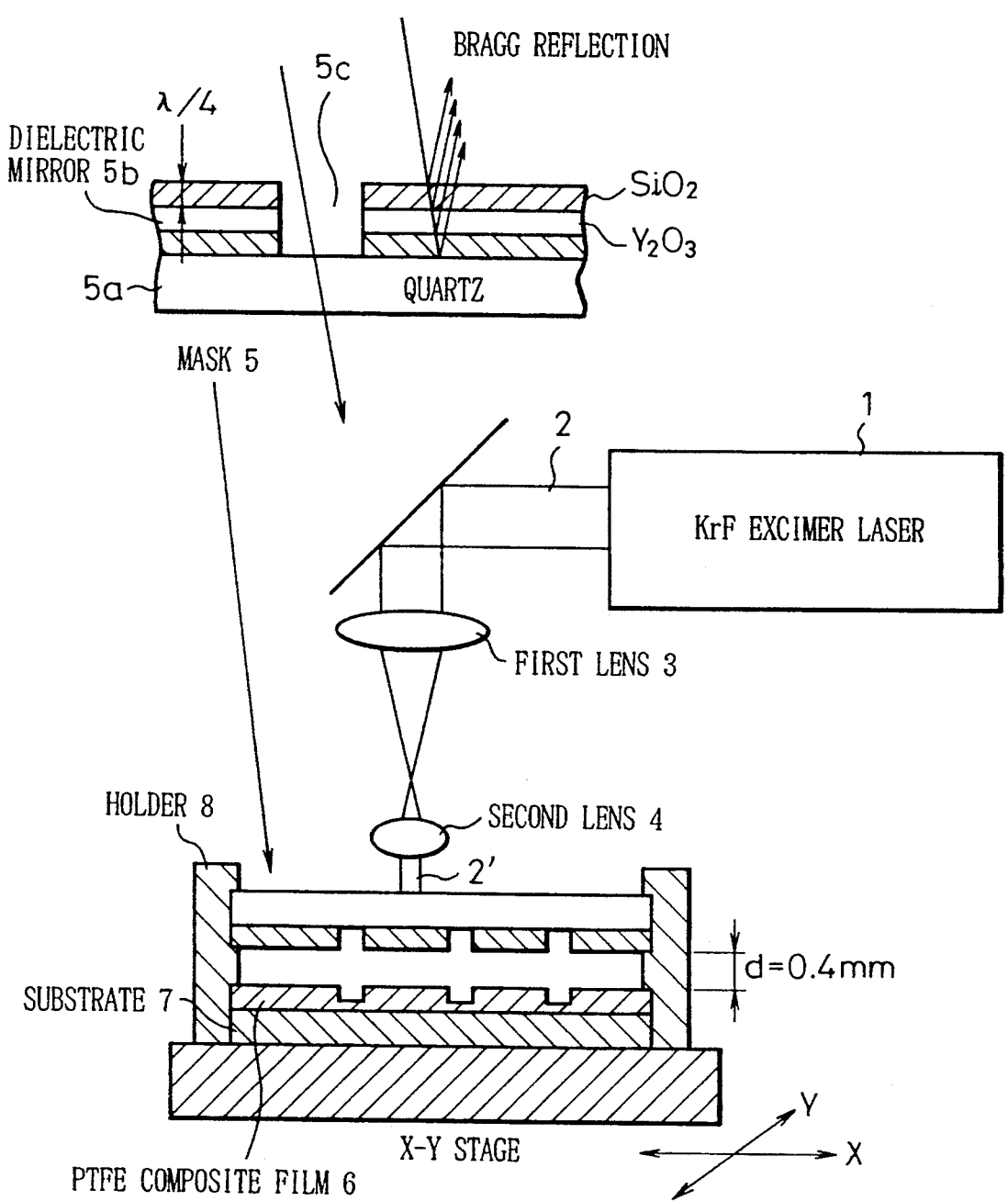
FIG. 1 is a schematic sectional view showing the structure of an exposure optical system used for an embodiment of the present invention.

The present invention provides an insulating material for a thin film multi-layered wiring substrate that has a low dielectric constant as well as low hygroscopicity, is excellent in heat resistance and can be laminated by allowing a porous perfluorocarbon polymer substrate to be impregnated with a thermosetting resin containing a benzocyclobutene ring (hereinafter abbreviated to "BCB") as a functional group.

The BCB resin has a low dielectric constant ($\epsilon = 2.7$) and has excellent heat resistance. An example of the fabrication of MCM by coating and laminating this resin on a support substrate and characteristics of the resulting MCM have been reported (IEEE Transactions on Components, Hybrids, and Manufacturing Tec., Vol. 13, pp. 347, 1990; J. Electronic Materials, Vol. 19, p. 1357, 1990, etc.).

However, an attempt to fabricate a composite structure of the BCB resin with PTFE to further reduce the dielectric constant has not yet been known.

The inventors of the present invention have found that the BCB resin has a low dielectric constant, has excellent heat resistance, has a low surface tension and is liquid, so that porous PTFE, into which a liquid cannot easily permeate, can be impregnated with this BCB resin.

It has also been confirmed that high adhesion can be obtained in the same way as when the BCB resin is used alone.

Here, a dielectric constant varies depending on the volume ratio of PTFE to BCB, and decreases as a volume occupying ratio of PTFE increases. From this aspect, PTFE preferably has a large volume ratio and a small porosity.

However, when the volume ratio of PTFE exceeds 50% (or when the porosity is not greater than 50%), impregnation of BCB becomes more difficult. Preferably, therefore, the porosity is set to a range of 50 to 80% in practice.

Next, the advantages brought forth when the BCB resin is made composite with PTFE are the improvements in the reduction of stress and in brittleness and the low dielectric constant.

In other words, the BCB resin is not free from the problem that it is likely to crack because it has a small elongation, but the soft PTFE fibers inhibit the growth of cracks, and the composite article becomes resistant or difficult to crack as a whole.

When the BCB resin is thermally set at around 220° C. and is then cooled down to room temperature, a tensile stress develops due to the difference of thermal expansion coefficients between the BCB resin and the support substrate, but when the BCB resin is made composite with PTFE, crazes (very small voids) occur in the PTFE portion and can reduce the stress.

The ablation technique utilizing an excimer laser beam has drawn increasing attention in recent years as a new fabrication technique.

The excimer laser is a gas laser utilizing an excimer of a rare gas and a halogen, and can excite high density ultra-violet rays.

When an optical pulse having a high intensity of up to 100 MW/cm$^2$ at the peak, such as the excimer laser beam, is irradiated onto ordinary materials, chemical bonds of the material are destroyed in an instant and the surface layer is evaporated because the materials have strong absorption in the ultra-violet range. This phenomenon is photo-initiated ablation, and the excimer laser technique is one that utilizes this phenomenon.

Although a large number of combinations exist between the rare gas and the halogen, KrF laser (wavelength = 248 nm) and XeCl laser (wavelength = 308 nm) having a high oscillation output and high stability have been examined for industrial applications.

One of the characterizing features of the excimer laser fabrication technique is that the finish of the section is sharp and a relatively wide area such as up to 10 mm$^2$ can be machined collectively. Accordingly, a delicate pattern can be easily formed by effecting exposure through a mask. (Refer to T. A. Znotis et al, "Laser Focus", May, 54, 1987, and Ishizaka "Applied Mechanical Optics", September, 1990, pp 94–99.)

For this reason, the excimer laser fabrication technique has drawn increasing attention as a via hole formation technique for a thin film multi-layered circuit (F. Bachmann: Chemtronics, September, Vol. 4, 1989, etc).

Among the basic studies of excimer laser ablation without specific limitation of application, studies directed to a variety of resins have been made, and decomposition of PTFE has also been reported.

PTFE is transparent to a beam having a wavelength of not smaller than 190 nm. Therefore, a fluorine ($F_2$) laser (wavelength=157 nm) having a smaller wavelength and a ultra-short pulse KrF laser in the order of femto-second must be used.

Nonetheless, the development of apparatuses for these layers has just started, and these lasers cannot yet be used for industrial application from the viewpoint of output, stability and price.

To utilize the lasers for forming the via hole, optical components such as a lens, a mirror, and so forth, must be used, but practical optical components capable of withstanding the vacuum ultra-violet beams having a high intensity and ultra-short pulse ultra-violet beams have not yet been developed.

Accordingly, the object of machining by the excimer laser fabrication technique, which is directed to the thin film multi-layered structure, is exclusively limited to polyimide, and no report has yet been made on the formation of the via hole in an insulating film made of PTFE using a commercially available KrF or XeCl laser.

The present invention is directed to a porous PTFE film impregnated with a thermosetting resin containing an aromatic ring or hetero ring, and forms a via hole by using an industrially utilizable KrF or XeCl laser, more definitely, an excimer laser having an emission wavelength of at least 190 nm and an emission time of at least 1 ns, thereby effecting laser ablation on the insulating film is described above.

When the KrF or XeCl laser beam is irradiated onto porous PTFE impregnated with the thermosetting resin containing an aromatic ring or hetero ring, the aromatic ring and the hetero ring of the thermosetting resin absorb the laser beam and are decomposed and drastically gassified and jet out, but PTFE is not decomposed because it does not absorb the laser beam.

The inventors of the present invention have found that when the thermosetting resin is decomposed, gassified and jets out, though PTFE itself is not decomposed, fibrous PTFE is sheared off, jets out and is removed with the decomposition gas, so that the via hole is formed.

Since corrugation occurs on the side surfaces of the hole thus formed, the surfaces are not smooth. However, via connection can be made even if any corrugation exists on the side surfaces, because the diameter of the via hole to be formed in the wiring substrate is as large as tens of micron-meters.

For the reason described above, the via hole can be formed by the ordinary ns emission KrF laser beam without using the fluorine ($F_2$) laser having a short wavelength (wavelength=157 nm) or the ultra-short pulse KrF laser in the order of femto-second.

Another advantage of this laser beam fabrication method is that the machining time is short. In other words, since PTFE can be removed by shearing but not by decomposition, the optical energy necessary for the decomposition of PTFE need not be taken into account.

In the case of the volume occupying a ratio of PTFE of ½, for example, fabrication can be carried out at an etching rate of about 1.5 times when compared with the case of a film consisting only of a thermosetting resin.

Besides the BT resin described above, the impregnation resin for the PTFE film includes a thermosetting resin containing an aromatic ring such as a bis-maleimide resin, an epoxy resin, a benzocyclobutene resin (hereinafter abbreviated to the "BCB resin"), and so forth. Among them, the BCB resin is the most preferred thermosetting resin.

Hereinafter, the present invention will be explained in further detail with reference to Examples thereof.

EXAMPLE 1

An impregnation solution was prepared by adding 10g of methyl isobutyl ketone to 20 g of a commercially available BCB resin solution (55% BCB resin solution in xylene, "XU1300" of The Dow Chemical).

A 80 μm-thick PTFE membrane filter (porosity=75%, "FP-200", Sumitomo Denko K.K.) was used as porous PTFE, and a copper electrode having a diameter of 38 mm was formed on this PTFE.

First of all, the porous PTFE film described above was placed on a 70 mm-square glass substrate, and was allowed to be impregnated with the BCB resin solution by printing a pre-determined quantity of the BCB resin solution on the PTFE film by a screen printing method.

The resulting assembly was treated in an oven at 100° C. for 30 minutes to remove the solvent. Next, the assembly was placed into a vacuum oven, and BCB was thermally set at 240° C. in the course of one hour to obtain a homogenous PTFE film, the voids of which were filled.

For comparison, a film consisting of the BCB resin alone was formed on the same 70 mm-square substrate.

Adhesion of each sample was examined by a checkerboard test, but no peel was observed on glass and on the copper electrode.

Next, an opposed electrode was formed on the film thus set, and a dielectric constant was measured.

As a result, it was confirmed that a dielectric constant was 2.55 (1 MHz), it was 2.72 when the BCB resin was alone, and the dielectric constant could thus be reduced by making composite the BCB resin with PTFE.

Another film was laminated on the set film to obtain a 200 μm-thick three-layered film, but no peel of the film was observed.

However, cracks and peel occurred at a thickness of 100 to 120 μm when only the BCB resin was used.

Next, via formation was carried out by irradiating a KrF excimer laser beam at an irradiation energy of 0.8 J/cm² per shot through a mask having 20×20 apertures each having a diameter of 50 μm.

As a result, 400 perfect circle holes having a diameter of 60 μm at the open portion and 35 μm at the bottom of the hole could be formed in the film having a film thickness of 80 μm.

After the formation of the holes, copper was vacuum deposited, and was then removed in such a manner as to leave the portions around the holes. When the via connection was examined, all of the 400 holes were found to be reliably connected.

EXAMPLE 2

An impregnation solution was prepared by adding 10 g of methyl isobutyl ketone to 20 g of a commercially available BCB resin solution (55% BCB resin solution in xylene, "XU1300", The Dow Chemical).

PTFE, which was made porous by biaxial stretching to a porosity of 75% and to a thickness of 30 μm, was used as a porous PTFE.

First of all, 6 in.-square glass having 1,000 electrodes formed thereon was used as a substrate, and the porous PTFE film was placed on this substrate. The impregnation solution described above was printed in a predetermined quantity on the porous PTFE film in accordance with a screen printing method so that the porous PTFE film was impregnated with the BCB resin solution.

After the solvent was removed by hot air drying, the resulting assembly was placed into a nitrogen ($N_2$) oven, and BCB was thermally set at 240° C. in the course of one hour to obtain a homogeneous PTFE film which was 20 μm thick and the voids of which were filled.

For comparison, a 20 μm-thick film made of the BCB resin film alone was formed on the same substrate.

When a dielectric constant was measured for each of these samples, the dielectric constant of the porous PTFE film impregnated with BCB was 2.45 (1 MHz), whereas that of the film made of the BCB resin alone was 2.72.

Next, the formation of via holes was carried out by an "equi-multiple mirror mask exposure method" in accordance with the present invention using a KrF excimer laser.

FIG. 1 shows the structure of the optical system used. A laser beam 2 leaving the KrF excimer laser 1 was converged or scaled down by a first lens 3 to improve the strength per unit area, was then converted to parallel beams 2' having a sectional area of about 2×6 mm by a second lens 4, and was thereafter irradiated to the PTFE composite film 6 impregnated with the BCB resin through a mask 5.

The mask 5 was produced by forming a hole pattern 5c on a dielectric mirror 5b obtained by laminating multiple $SiO_2$ and $Y_2O_3$ layers on a quartz plate 5a as shown in the upper left portion of FIG. 1, and using this dielectric mirror 5b as a shading layer.

After this mask 5 was positioned to the PTFE composite film 6 formed on a substrate 7, they were placed upon one another with a predetermined gap d between them by a holder 8, and were simultaneously fixed to an X-Y stage 10.

The stage 10 was moved in an X direction (in the direction of the minor axis of the beam) while the laser 1 was being oscillated, was deviated 1 mm in a Y direction at the end portion of the substrate, was then moved in the X direction and was thereafter deviated 1 mm at the end portion. These operations were repeated until the entire surface of the substrate was machined.

The fabrication condition was as follows:
output: 50 W, pulse width: 16 ns
optical energy on mask incident surface: 20 W (100 mJ×200 Hz)
beam contraction ratio: 4/15
mask hole diameter: 30 μm
gap between the mask and the film to be machined: 0.4 mm
stage moving speed in the X direction: 23 mm/sec Ablation machining was carried out under the conditions described above, and holes having a diameter of 40 to 45 μm at the open portions and 20 to 25 μm on the electrode surface could be formed in the porous PTFE film impregnated with BCB.

Incidentally, when the film was made of BCB alone and was 20 μm thick, machining could be made to the bottom of the film (the electrode surface) at the stage moving speed described above, and in consequence, the moving speed had to be reduced to 19 mm/sec or below.

After the via holes were formed, the substrate was washed with ethanol, and any surface contamination was removed by $O_2$ plasma.

Figure 2:
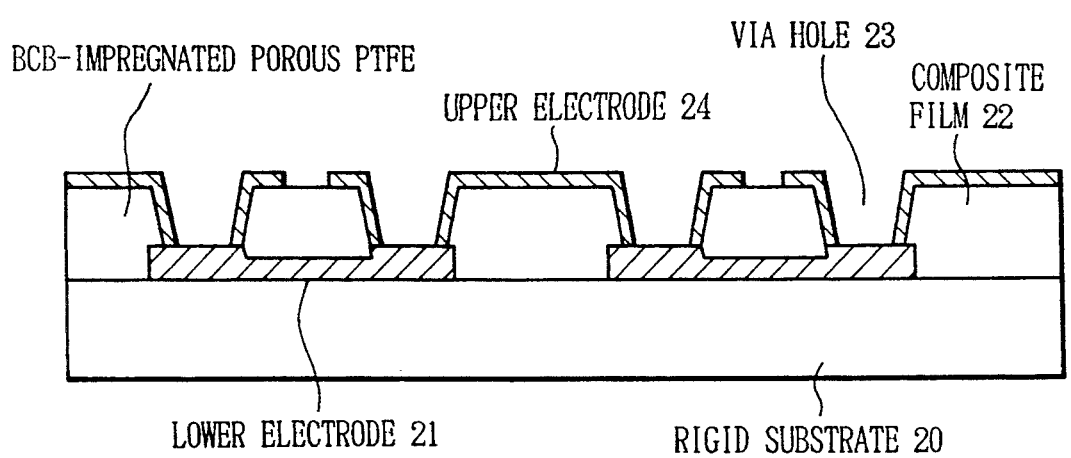
FIG. 2 is a sectional view of a via structure obtained in an embodiment of the present invention.

Next, upper electrodes 24 were formed as shown in FIG. 2, and via connection with the lower electrodes 21 was measured. As a result, inferior connection due to insufficient exposure of the lower electrodes 21 resulting from insufficient machining and breakage on the side surfaces of the via holes 23 did not exist at all, and it was confirmed that via connection was effected reliably.

Figure 3:
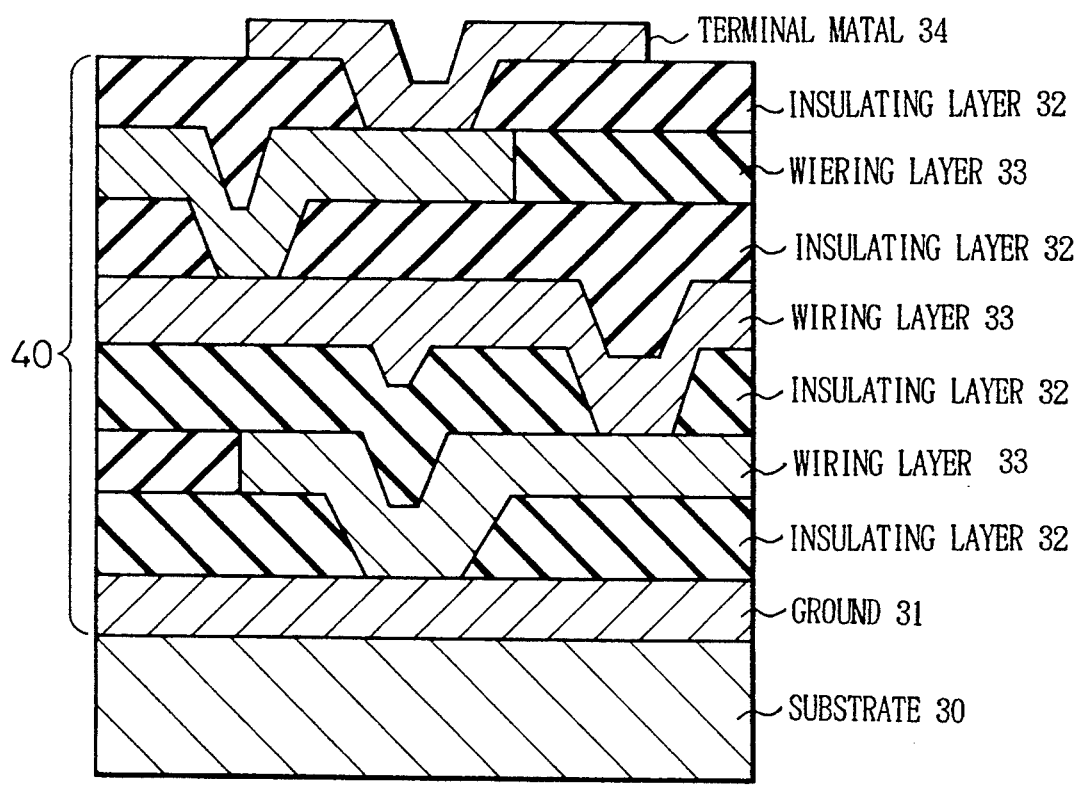
FIG. 3 is a schematic sectional view of an embodiment of the multi-layered wiring substrate according to the present invention.

By using this via connection structure, a multi-layered wiring substrate of such a structure as shown in FIG. 3 can be prepared, in which a wiring layer 31, 33, 34 and an insulating layer 32 are alternately laminated on a substrate 30 and the wiring layers 31, 33, 34 are connected by via connections. An adhesion-improving layer may be formed between the rigid substrate 30 and the multi-layered wiring structure 40.

EXAMPLE 3

Bis(amino-methylphenyl)hexafluoropropane (hereinafter abbreviated to "BIS-ST-AF") and a bis-maleimide derivative of this compound were dissolved at a weight ratio of 1:2 in a mixed solution of N-methylpyrolidone and tetrahydrofuran. The same porous PTFE film as the one used in Example 2 was placed on a glass substrate having a dimension of 70×70×1.1 mm and was impregnated with the impregnation solution described above. Thereafter, the substrate assembly was heated at 350° C. in a $N_2$ atmosphere so as to thermally set the thermosetting resin and to form a film having a dielectric constant of 2.8.

When the formation of the via holes was carried out for this film under the same conditions as that of Example 2, it could be confirmed that the holes having the same size as that of Example 2 were formed.

We claim:

1. A method of producing a multi-layered wiring substrate comprising alternately laminating a wiring layer and an insulating layer made of insulating material on a rigid support substrate, said insulating material being a porous perfluorocarbon polymer film having void portion impregnated with a thermally set resin having a benzocyclobutene ring.

2. A method of producing a multi-layer circuit substrate according to claim 1, further including forming via holes for connecting said layers by ablation utilizing an excimer laser beam.

3. A method of forming holes of a wiring substrate for forming via holes in an insulating film of a multi-layered wiring substrate by utilizing ablation by an excimer laser beam, wherein said insulating film is prepared by allowing a porous perfluorocarbon polymer film to be impregnated with a thermosetting resin containing an aromatic ring or hetero ring, and said excimer laser beam has a wavelength of not smaller than 190 nm and an emission time per pulse of at least 1 ns.

4. A method of forming via holes of a wiring substrate according to claim 3, wherein said thermosetting resin contains a benzocyclobutene ring in a structure thereof.

5. A method of forming via holes of a wiring substrate according to claim 3, wherein said excimer laser beam is a KrF or XeCl laser.

* * * * *